United States Patent
Sakakibara et al.

(10) Patent No.: US 7,604,697 B2
(45) Date of Patent: Oct. 20, 2009

(54) HETEROEPITAXIAL GROWTH METHOD FOR GALLIUM NITRIDE

(75) Inventors: Shingo Sakakibara, Hamamatsu (JP); Yoku Inoue, Hamamatsu (JP); Hidenori Mimura, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 55 days.

(21) Appl. No.: 11/077,129

(22) Filed: Mar. 11, 2005

(65) Prior Publication Data
US 2005/0239271 A1    Oct. 27, 2005

(30) Foreign Application Priority Data
Mar. 12, 2004    (JP)    ............................ 2004-071593

(51) Int. Cl.
*C30B 21/02*    (2006.01)

(52) U.S. Cl. ............................ 117/86; 117/89; 117/95; 117/101
(58) Field of Classification Search ...................... 117/1
See application file for complete search history.

(56) References Cited

U.S. PATENT DOCUMENTS
6,033,490 A * 3/2000 Kimura et al. ............. 148/33.4

FOREIGN PATENT DOCUMENTS
JP      08-264439    * 10/1996
JP      H08-264439 A  10/1996

* cited by examiner

*Primary Examiner*—Robert M Kunemund
(74) *Attorney, Agent, or Firm*—Dickstein Shapiro LLP

(57) ABSTRACT

A heteroepitaxial growth method for gallium nitride yields gallium nitride which contains good quality fine crystals and has excellent optical properties, on a quartz substrate or a silicon substrate. The method comprises a step A of nitriding the surface of the substrate, and a step B of depositing or vapor depositing at least one atom layer of gallium.

13 Claims, 6 Drawing Sheets

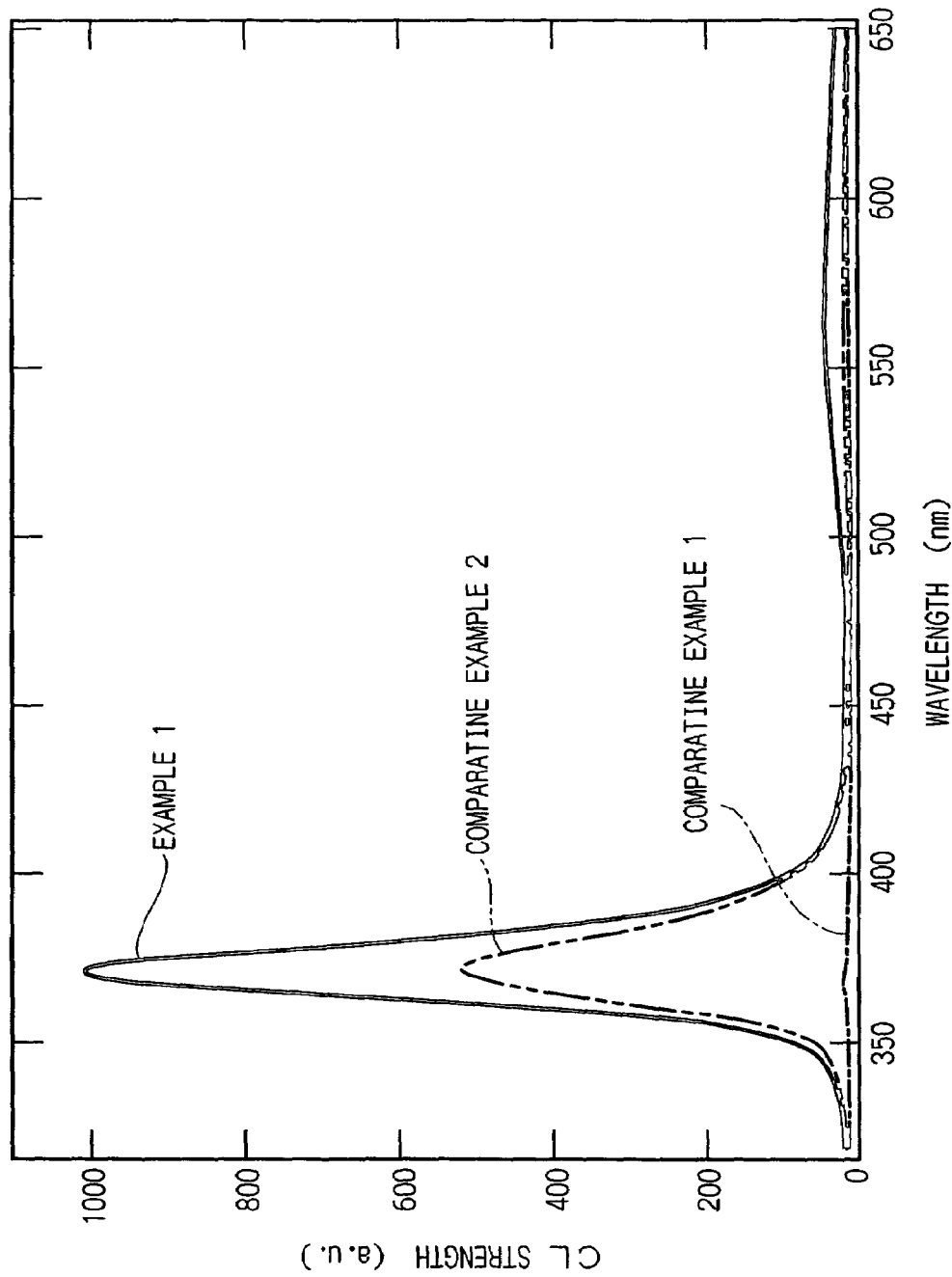

FIG. 6
COMPARATIVE EXAMPLE 3
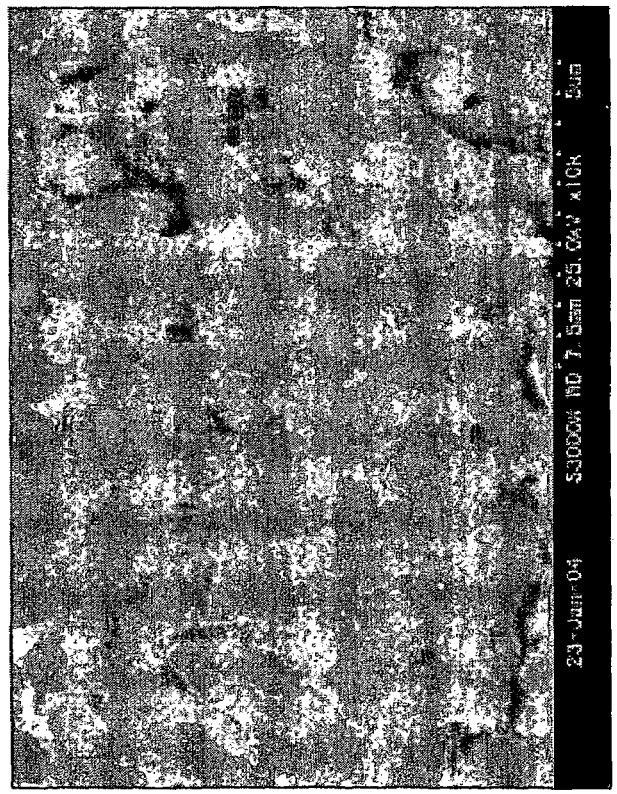
EXAMPLE 2

HETEROEPITAXIAL GROWTH METHOD FOR GALLIUM NITRIDE

BACKGROUND OF THE INVENTION

1. Field of the Invention

The present invention relates to a heteroepitaxial growth method for gallium nitride on a substrate.

Priority is claimed on Japanese Patent Application No 2004-071593, filed Mar. 12, 2004, the content of which is incorporated herein by reference.

2. Description of Related Art

Research for nitride compounds of gallium nitride (GaN) as a blue light emitting device material is advancing. Recently, a blue light emitting diode, which emits very bright light, has been developed and has been commercialized.

However, since it is difficult to produce single bulk crystals of gallium nitride having excellent crystalline properties, gallium nitride is subjected to heteroepitaxial growth on other materials such as sapphire, and thereby a thin film is prepared.

Specifically, a preparation method for single crystal nitride semiconductor is suggested in Japanese Unexamined Patent Application, First Publication No. H8-264439. The preparation method comprises the steps of making the surface temperature of a sapphire substrate high, and supplying nitrogen alone, and thereby a uniform nitrided surface is prepared. After that, while maintaining the nitrided surface at a relative low temperature, cationic elements such as gallium are deposited uniformly. Then, when nitrogen is supplied while the nitrided surface is maintained at a high temperature again, the surface is nitrided, and excess cationic elements are evaporated again. Due to this, bonding between cationic elements and nitrogen atoms is promoted, and a homogeneous initial layer of nitride semiconductors is prepared.

According to Japanese Unexamined Patent Application, First Publication No. H8-264439, a single crystal nitride semiconductor which is prepared by forming single crystal gallium nitride on a sapphire substrate has excellent crystalline properties.

In order to grow such single crystal gallium nitride having excellent crystalline properties, it is necessary to grown a buffer layer such as GaAlN, AlN, and the like at a low temperature, and then to grown GaN.

Nitride semiconductors can be used not only for blue light emitting diode material, but also fluorescent material which is excited by a light source for emitting ultraviolet light or electrons of FED (field luminescence display), and the like.

In these cases, it is considered that optical properties are more important than crystalline properties. Optical properties are evaluated by irradiating electrons on the nitride semiconductor, and mining cathode luminescence (CL).

In Japanese Unexamined Patent Application, First Publication No. H8-264439, the obtained gallium nitride is a single crystal. When the present inventors examined the strength of cathode luminescence (CL) of the obtained gallium nitride, CL strength was somewhat weak, and there was a problem that optical properties are insufficient.

In addition, since expensive material such as a sapphire substrate is used in conventional methods, there is a problem of cost.

In consideration of the above-described problems, an object of the present invention is to provide a heteroepitaxial growth method for gallium nitride which can prepare gallium nitride, which contains good quality fine crystals and has excellent optical properties, on a quartz substrate or a silicon substrate.

SUMMARY OF THE INVENTION

In order to achieve the object, the present invention provides a heteroepitaxial growth method for gallium nitride on the surface of a quartz substrate or a silicon substrate, wherein the method comprises a step A of nitriding the surface of the substrate, and a step B of depositing or vapor depositing at least one atom layer of gallium.

In addition, the present invention provide another heteroepitaxial growth method for gallium nitride on the surface of a quartz substrate, wherein the method comprises a step B of depositing or vapor depositing at least a one atom layer of gallium.

In the heteroepitaxial growth method for gallium nitride, it is preferable for the step A that the surface of the substrate is nitrided by at least one method selected from the group consisting of exposing the surface of the substrate to an ammonia gas atmosphere, a gas atmosphere containing compounds having an ammonia group, a hydrazine gas atmosphere, and a hydrazine derivatives gas atmosphere, a nitrogen atmosphere, and nitrogen radicals atmosphere; contacting the surface of the substrate with a nitride solution; and striking nitrogen ions to the surface of the substrate.

In the heteroepitaxial growth method for gallium nitride, it is preferable to comprise a step C of faker nitriding the surface of the atom layer which is obtained by depositing or vapor depositing gallium elements, and preparing a surface thin film made of gallium nitride or a nitride crystal particle group on the atom layer of gallium on the substrate, immediately after the step B.

In the heteroepitaxial growth method for gallium nitride, it is preferable for the step C to be a step for preparing a surface thin film made of gallium nitride or a nitride crystal particle group by at least one of exposing the surface of the atom layer of gallium, which is obtained by depositing or vapor depositing, to an ammonia gas atmosphere, a gas atmosphere containing compounds having an ammonia group, a hydrazine gas atmosphere, and a hydrazine derivatives gas atmosphere, a nitrogen atmosphere, and a nitrogen radicals atmosphere; contacting the surface of the atom layer of gallium with a nitride solution; and striking nitrogen ions to the surface of the atom layer.

In the heteroepitaxial growth method for gallium nitride, it is preferable for the step C to be a step of supplying gallium elements together with a nitrogen supplying source containing nitrogen atoms which is selected from the group consisting of ammonia, compounds having an ammonia group, hydrazine, hydrazine derivatives, nitrogen, nitrogen radicals, nitride solutions, and nitrogen ions, and preparing a surface thin film made of gallium nitride or a nitride crystal particle group.

In the heteroepitaxial growth method for gallium nitride, it is preferable to comprise a step D of repeating the step B and the step C, immediately after the step C.

In the heteroepitaxial growth method for gallium nitride, it is preferable for the step D to be a step of supplying elemental gallium together with the nitrogen source containing nitrogen atoms, and thereby the step B and the step C are simultaneously performed.

According to the heteroepitaxial growth method for gallium nitride of the present invention, it is possible to prepare a gallium nitride containing good quality fine crystals and having excellent optical properties on a quartz substrate or a silicon substrate.

BRIEF DESCRIPTION OF THE DRAWINGS

FIG. 3 shows CL property of gallium nitride obtained in the Example 1 and the Comparative Examples 1 and 2.

FIG. 4 is a SEM picture and a TEM picture showing gallium nitride fine crystals grown on a silicon substrate in the Example 1.

FIG. 6 shows SEM pictures of gallium nitride grown on a quart substrate in the Example 2 and the Comparative Example 3.

DETAILED DESCRIPTION OF THE INVENTION

Figure 1:
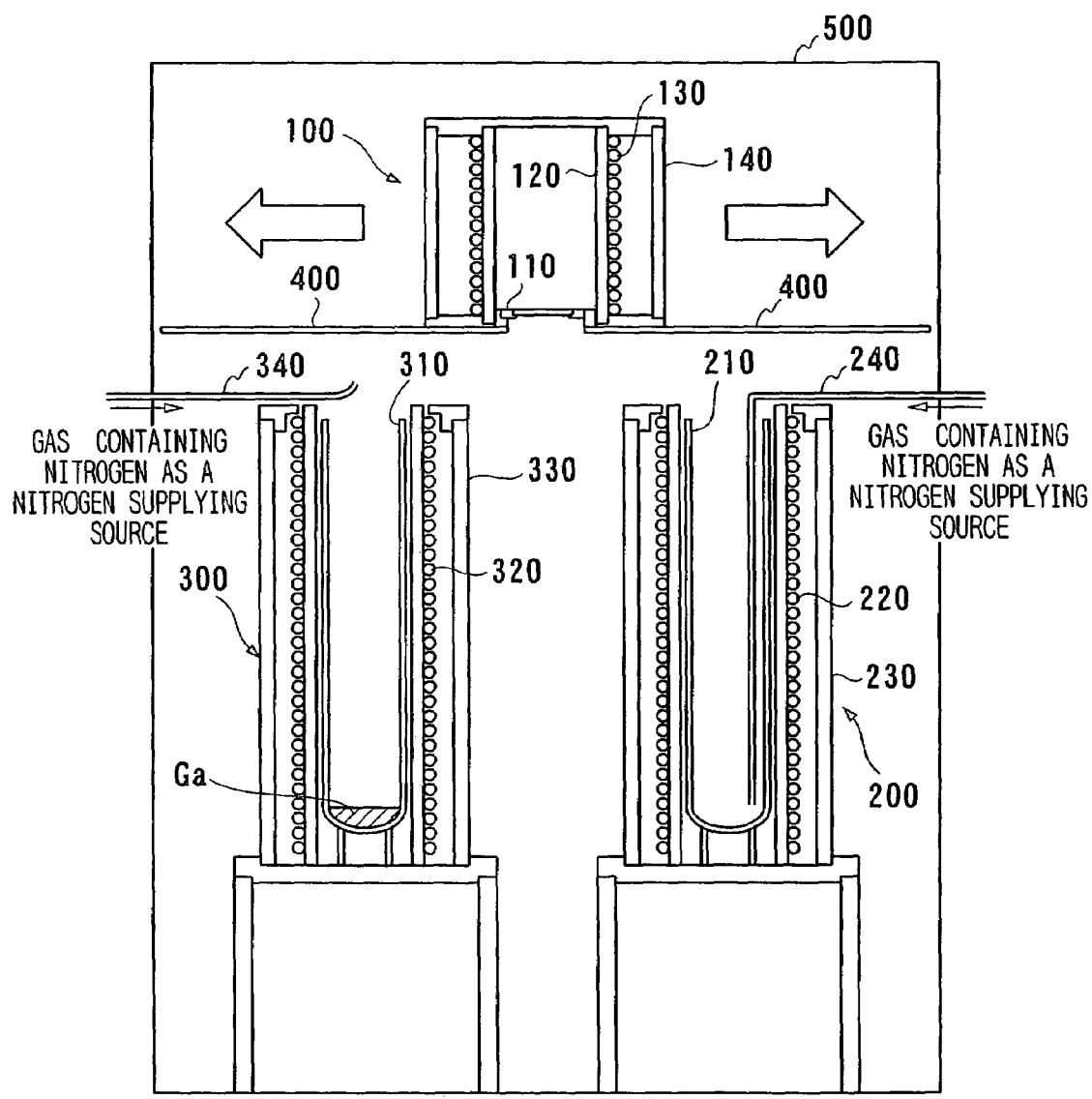
FIG. 1 shows the structure of a gallium nitride crystal growth device used in heteroepitaxial growth of the present invention.

FIG. 1 shows the structure of a gallium nitride crystal growth device used in heteroepitaxial growth of the present invention. The device comprises a substrate containing portion 100 for containing a substrate so as to expose the vertical lower surface and heating the substrate, a first growth chamber 200 having a vertical upper opening for heating a nitrogen source containing nitrogen atoms (for example, a compound having an ammonia group, and the like), a second growth chamber 300 having a vertical upper opening for heating gallium element material to be grown and the nitrogen supplying source containing nitrogen atoms in a gas state or the like, a substrate stage 400 for moving the surface of the substrate which is exposed in the substrate containing portion 100 toward the upper portion of the opening of the first growth chamber 200 or the second chamber 300, and a vacuum vessel 500 for containing the substrate containing portion 100, the first growth chamber 200, the second growth chamber 300, and the substrate stage 4, which is a driving portion, and for maintaining a residual vapor pressure inside thereof to 0.13 Pa or less.

The substrate containing portion 100 comprises a substrate holder 110, a quartz tube 120 having a vertical lower opening for containing the substrate holder 110, a substrate heater 130 which is made of tungsten wire wound around the quartz tube 120 and a stainless steel tube 140 which encloses the quart tube 120 and the substrate heater 130. The stainless steel tube 140 is provided to improve heating efficiency.

The first growth chamber 200 comprises a quartz tube 210 having a bottom, a heater 220 which is made of tungsten wire wound around the quartz tube 210, and a stainless steel tube 230 which encloses the quartz tube 210 and the heater 220. The stainless steel tube 230 is provided to improve heat efficiency. In addition, in the quartz tube 210, a quartz pipe 240 for supplying gas or the like which is a nitrogen supplying source containing nitrogen atoms is inserted.

The second growth chamber 300 comprises a quartz tube 310 having a bottom, a heater 320 which is made of tungsten wire wound around the quart tube 310, and a stainless steel tube 330 which encloses the quartz tube 310 and the heater 320. The stainless steel tube 330 is provided to improve heat efficiency. In addition, above the quartz tube 310, a quartz pipe 340 for supplying gas containing nitrogen which is a nitrogen supplying source or the like is provided. Elemental gallium material is stored in the quartz tube 310.

The gap between the substrate stage 400 and the first and second growth chambers 200 and 300 is freely adjusted. In addition, the substrate stage 400 is provided so as to slide freely above the first and second growth chambers 200 and 300.

The temperature of the substrate can be monitored using a thermocouple contacted with the substrate. A thermocouple is also contacted with the bottom and opening of the first and second growth chambers 200 and 300, and the temperature at these portions can also be monitored.

The heteroepitaxial growth method for gallium nitride of the preset invention will be explained below. One embodiment of the heteroepitaxial growth method for gallium nitride of the present invention is shown in FIG. 2.

Figure 2A:
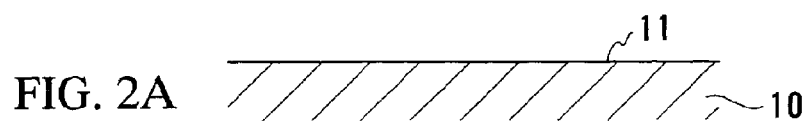
FIGS. 2A to 2E shows one embodiment of the heteroepitaxial growth method for gallium nitride of the present invention.

In this embodiment, a substrate 10 having a clean surface 11 is prepared, as shown in FIG. 2A. In order to prepare the clean surface 11, the substrate 10 is cleaned using an etchant such as sulfuric acid-hydrogen peroxide; then the surface is subjected to a thermal cleaning in the first growth chamber 200 of the gallium nitride crystal growth device show in FIG. 1 under conditions in which the pressure is decreased to approximately 0.1 to 0.3 mPa, the temperature is 800 to 1,200° C., and preferably to 900 to 1,100° C., and the treating time is 15 to 60 minutes, and preferably 20 to 40 minutes.

Figure 2B:
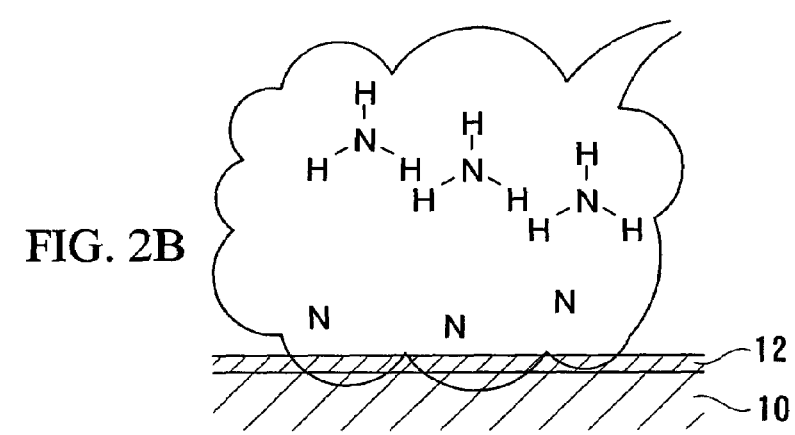

After that, a uniform nitrided surface 12 is prepared shown in FIG. 2B in a step A of converting oxygen in the surface 11 of the substrate 10 into activated nitrogen atom N of a nitrogen supplying source containing nitrogen atoms, and nitriding the surface of the substrate.

In the nitriding step A, the temperature of the substrate 10 is maintained to 300 to 1,000° C., and preferably to 500 to 600° C., the temperature in the first growth chamber 200 of the gallium nitride crystal growth device show in FIG. 1 is maintained 700 to 1,000° C., and preferably to 800 to 900° C., and the nitrogen supplying source containing nitrogen atoms is introduced into the first growth chamber 200. Examples of the nitrogen supplying source containing nitrogen atoms include ammonia, compounds having an ammonia group, hydrazine, hydrazine derivatives, nitrogen, nitrogen radicals, nitride solutions, and nitrogen ions. Among these, ammonia is the most preferable. The nitrogen supplying source containing nitrogen atoms is supplied so that the flow rate is adjusted to 5 to 200 cm$^3$/min, and preferably 50 to 100 cm$^3$/min, and the substrate 10 is allowed to stand for 5 to 60 minutes, and preferably 5 to 20 minutes, and thereby the surface of the substrate 10 is nitrided.

This nitriding step A is preferably performed by at least one of exposing the surface of the substrate 10 to an ammonia gas atmosphere, a gas atmosphere of compounds having an ammonia group, a hydrazine gas atmosphere, a hydrazine derivatives gas atmosphere, and more preferably at least one of exposing the surface of the substrate 10 to an ammonia gas atmosphere, a nitrogen atmosphere, and a nitrogen radicals atmosphere, contacting the surface of the substrate 10 with a nitride solution, or striking nitrogen ions to the surface of the substrate 10.

After that, inflow of the nitrogen supplying source containing nitrogen atoms is stopped and the temperature of the substrate 10 is fallen to 500 to 700° C., and preferably to 550 to 600° C. Then, the substrate 10 is moved to the second growth chamber 300 of the gallium nitride crystal growth device show in FIG. 1, and the step B of depositing or vapor depositing at least one atom layer of gallium is performed. The temperature in the gallium vapor deposition step B is preferably over 550° C. and less than 600° C. In the present invention, even when the temperature range of the vapor deposition step B is broader than the above range, gallium nitride fine crystals are prepared, which is different from the case of Japanese Unexamined Patent Application, First Publication No. H8-264439.

The vapor evaporation period depends on the thickness of the gallium nitride to be prepared. The thickness of gallium which is deposited or vapor deposited is 1 to 20 nm, and preferably 1 to 10 nm.

Figure 2C:
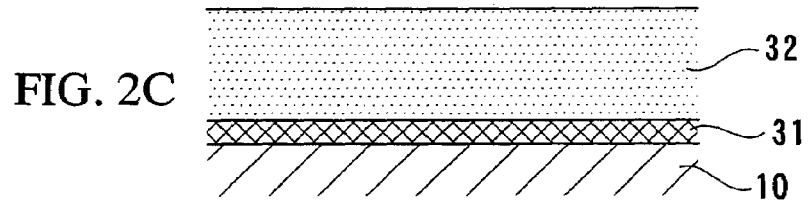

By the gallium vapor deposition step B, the nitrided surface 12 is changed to a gallium nitride layer 31, and a gallium layer 32 is further prepared on the gallium nitride layer 31 as shown in FIG. 2C.

Figure 2D:
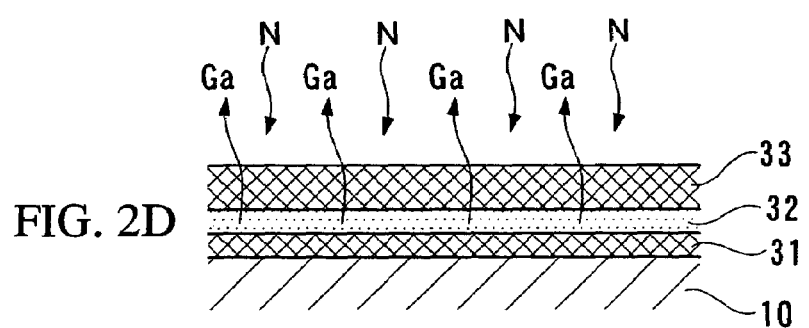

Then, after stopping the supplying gallium, the substrate 10 moves to the first growth chamber 200 of the gallium nitride crystal growth device show in FIG. 1, and the nitrogen supplying some containing nitrogen atoms is introduced again, and thereby the nitriding step C is performed. During the nitriding step C, the temperature of the substrate 10 is raised to 800 to 1,200° C., and preferably to 900 to 1,100° C., and this condition is maintained for less than 20 minutes, and preferably less than 5 minutes. Thereby, a face thin film made of gallium nitride fine crystals or a nitride crystal particle group 33 is prepared together with re-evaporation of excess gallium as shown in FIG. 2D.

In this nitriding step C, the surface of the atom layer of gallium, which are deposited or vapor deposited, is exposed to an ammonia gas atmosphere, a gas atmosphere of compounds having an ammonia group, a hydrazine gas atmosphere, a hydrazine derivatives gas atmosphere, and more preferably to an ammonia gas atmosphere, a nitrogen atmosphere, contacting with a nitride solution, or striking nitrogen ions to the surface of the substrate 10.

During the nitriding step C, it is possible to supply gallium elements together with the nitrogen supplying source containing nitrogen atoms.

Figure 2E:
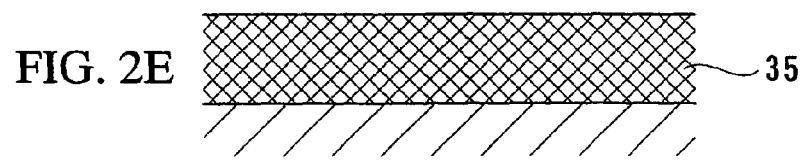

After the nitrification step C, a gallium nitride surface thin film layer or a nitride crystal particle group (abbreviated as "initial layer" below) 35 is continuously prepared in the nitrogen supplying source containing nitrogen atoms under conditions in which the substrate temperature is adjusted to 800 to 1,200° C., and preferably to 900 to 1,100° C., for 1 minute or longer, and thereby a quartz or a silicon/gallium nitride heteroepitaxial substrate is prepared shown in FIG. 2E. The thickness of gallium is adjusted to less than 10 nm.

After the substrate 10 is moved to the second growth chamber 300 of the gallium nitride crystal growth device show in FIG. 1, the gallium nitride surface thin film layer or the nitride crystal particle group is further grown on the initial layer 35 during step D. During this growth, a molar ratio between Ga and N which reach to the substrate per unit time is preferably 10,000 or less. For example, when this growth is performed under conditions in which 100 sccm of $NH_3$ is supplied, the temperature is 800 to 850° C., and the pressure is 0.013 to 0.13 Pa, the molar ratio between Ga and N is adjusted to 10,000.

During this growth, the substrate temperature is preferably 950 to 1,050° C. When the substrate temperature is adjusted to such a range, gallium nitride fine crystals are grown. In particular, when the substrate temperature is adjusted to 1,000° C., homogeneity of fine crystal is improved. Therefore, the most preferable substrate temperature during this growth is 1,000° C.

In the step D, the gallium vapor deposition step B and the nitriding step C may be performed repeatedly or the gallium vapor deposition step B and the nitriding step C may be performed simultaneously by supplying gallium elements and the nitrogen source containing nitrogen atoms simultaneously.

As explained above, in the heteroepitaxial growth method for gallium nitride of the present invention, the surface of the silicon substrate or the quartz substrate is heated to 300 to 1,000° C., and preferably to 500 to 600° C., and only nitrogen atoms are supplied to prepare a uniform nitrided surface. After that, the surface of the nitrided surface is maintained at a relative low temperature, and gallium elements are uniformly vapor deposited.

Then, the temperature of the substrate is raised to a high temperature such as 800 to 1,200° C., and preferably to 900 to 1,100° C., and nitrogen atoms are supplied to nitride the surface of the substrate, and excess elemental gallium is evaporated again together with nitriding of the surface by supplying nitrogen atoms, and a bonding between gallium atoms and nitrogen atoms is promoted. Thereby, the initial layer, which is the gallium nitride surface thin film layer or the nitride crystal particle group, is formed.

When gallium is heteroepitaxial grown in his manner, gallium nitride does not form single crystals or mixed crystals containing single crystals, and forms homogeneous gallium nitride fine crystals.

When, after the preparation of the initial layer, which is the gallium nitride surface thin film layer or the nitride crystal particle group, and which is made of gallium nitride having an average particle diameter of 10 to 100 nm, the step D is performed immediately, gallium elements, which reach to seed crystals in the gallium nitride surface thin film layer or the nitride crystal particle group, bond with nitrogen atoms at the surface of the seed crystals and are crystallized.

However, elemental gallium, which reaches a portion at which seed crystals are not formed and the nitrided surface 12 is exposed evaporates again, because bond energy between a nitrogen atom on the nitrided surface 12 and a gallium atom is smaller than heat energy which is received by a gallium element at the surface of the substrate heated to 900 to 1,100° C. Due to this, gallium nitride does not grow at the portion at which the nitrided surface 12 is exposed. That is, gallium nitride fine crystals grow only at the seed crystal particles.

Since the particle diameter of the gallium nitride surface thin film layer or the nitride crystal particle group is small, stress generated at the interface between the gallium nitride surface thin film layer or the nitride crystal particle group and the substrate decreases, and a conversion does not occur or only few conversions occur. Since the gallium nitride fine crystals grow a only seed crystals, the obtained fine crystals have high quality, that is, they have very few conversions or no conversion.

Thereby, emission attenuation due to the crystal conversion is remarkably prevented. Therefore, optical properties are remarkably improved by preparing gallium nitride fine crystals using the heteroepitaxial growth method for gallium nitride of the present invention.

In addition, when gallium nitride is prepared so as to have a fine crystal structure, and emission is performed by electron beam excitation such as cathode luminescence (CL), since electric field is concentrated at columnar portions which protrude from the surface of the film, columnar fine crystals having good crystal properties are excited preferentially. Compared with a flat gallium nitride crystal thin film, optical properties are improved.

Since the gallium nitride layer 31 has a thickness of 1 to 20 nm, and this is very thin, the gallium nitride layer 31 may be a nitride crystal particle group. If the gallium nitride layer 31 is in a film state (or the surface thin film layer state), it is believed that this film is easily broken. Therefore, it is believed that in the next step C, the film forms a nitride crystal particle group or the film is broken into many pieces and forms a surface thin film layer containing scattered portions at which gallium nitride grows. Gallium nitride fine crystals are grown by making the gallium nitride layer 31 thin regardless the states of the gallium nitride layer 31.

EXAMPLES

Below, the present invention will be explained with reference to the examples. Moreover, the present invention is not limited to the following examples.

Examples 1

Preparation of Gallium Nitride

Preliminary Treatment

The silicon substrate, which was cleaned using solvent and a sulfuric acid-hydrogen peroxide etchant, was subjected to a thermal cleaning in the first growth chamber 200 of the gallium nitride crystal growth device show in FIG. 1 under conditions in which the pressure was decreased to approximately 0.13 mPa, the temperature was 1,000° C., and the treating time was 30 minutes, and thereby the surface of the silicon substrate was cleaned.

Nitriding Step A

After tat, the temperature of the substrate was maintained to 1,000° C., and the temperature of the first growth chamber was adjusted to 890° C., and the uniform nitrided surface 12 is prepared by supplying ammonia gas having a purity of 99.9% at a flow rate of 10 cm$^3$/min, and was allowed to stand for 5 minutes.

Gallium Vapor Evaporation Step B

Next, the supply of gallium was stopped, the temperature of the substrate was decreased to 600° C., and the substrate was moved to the second growth chamber to evaporate gallium until the thickness was 10 nm.

Nitriding Step C

Next, the supply of gallium was stopped, the temperature of the substrate was decreased to 600° C., and the substrate was moved to the first growth chamber again. After that, ammonia gas was supplied and the temperature of the substrate was raised to 1,000° C. in an ammonia atmosphere, and thereby excess gallium was evaporated together with preparation of the surface thin layer made of gallium nitride fine crystals or the nitride crystal particle group.

Step D

By maintaining the substrate in the first growth chamber in an ammonia atmosphere at 1,000° C. for 1 minute or more, the surface thin film made of gallium nitride or the nitride crystal particle group, which forms the initial layer, was prepared, and thereby the silicon/gallium nitride heteroepitaxial substrate was prepared. Then the substrate was moved to the second growth chamber, and 100 scam of NH$_3$ was supplied to the surface of the initial layer under conditions in which the substrate temperature was 1,020° C., and the pressure was 0.65 Pa. Due to this, the surface thin film made of gallium nitride or the nitride crystal particle group which has a thickness of 1,500 nm was grown to the surface of the initial layer, and thereby gallium nitride fine crystals were obtained.

Cathode Luminescence Property

Cathode luminescence (CL) property was evaluated by measuring luminescence dispersed spectrum in a CL method. A cathode luminescence analyzer was used to irradiate an electron beam having an accelerating voltage of 2 kV to the fine crystals with an incidence angle of 45°, and CL strength of wavelength of 320 to 650 nm was measured. The CL property of the gallium nitride fine crystals were shown in FIG. 3.

Figure 4A:
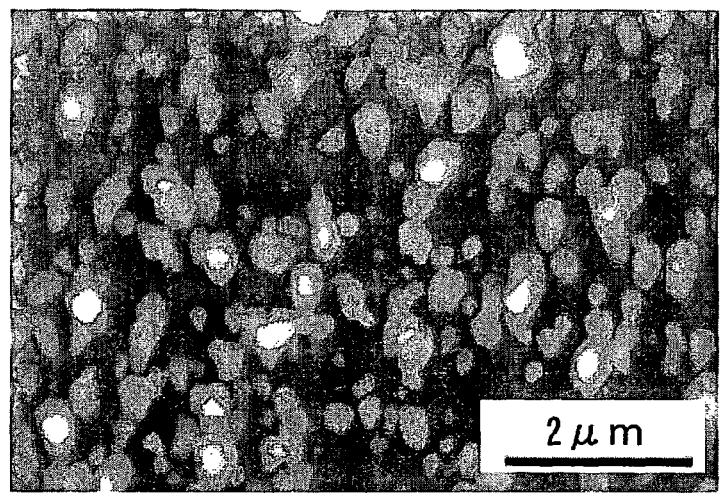
FIG. 4A is a SEM picture which is taken from the vertical d on relative to the substrate.
Figure 4B:
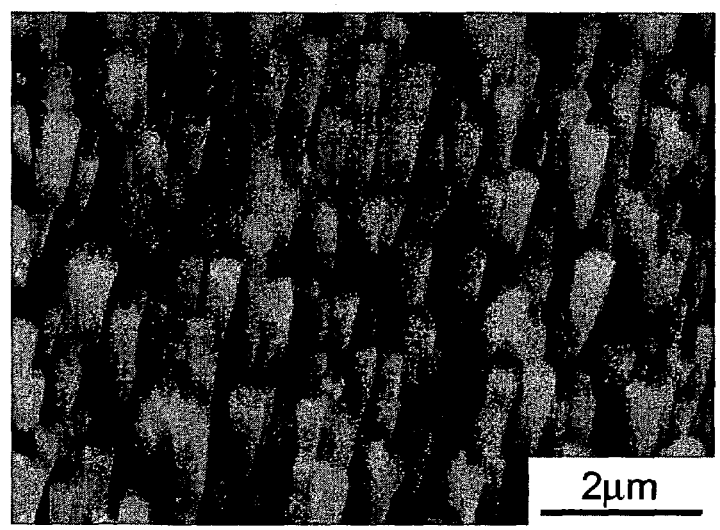
FIG. 4B is a SEM picture which is taken from the oblique upper direction relative to the substrate.
Figure 4C:
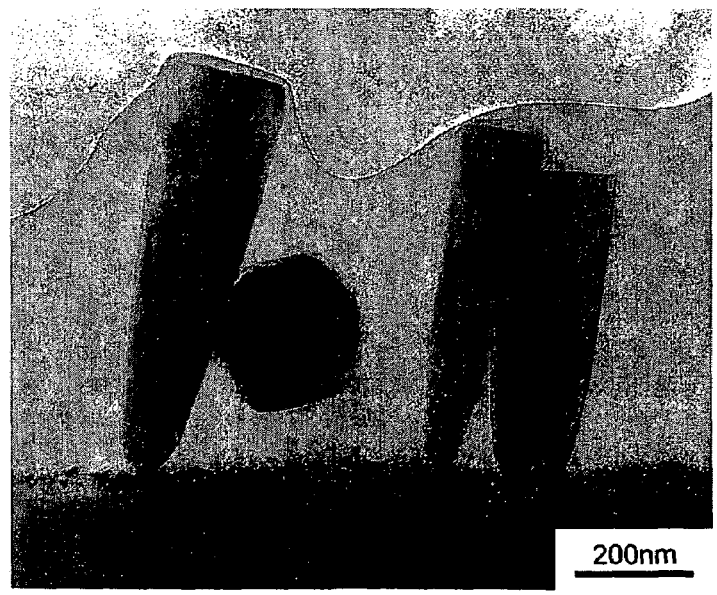
FIG. 4C is a TEM picture which is taken from another direction.

The surface of the gallium nitride fine crystals was observed using a scanning electron microscope (SEM) and a transmission electron microscope (TEM). FIG. 4 is a SEM and a TEM pictures showing gallium nitride fine crystals grown on a silicon substrate in the Example 1. FIG. 4A is a SEM picture which is taken from the vertical direction relative to the substrate. FIG. 4B is a SEM picture which is taken from the oblique upper direction relative to the substrate. FIG. 4C is a TEM picture which is taken from another direction.

Comparative Example 1

Gallium nitride single crystal was prepared in a manner identical to that of Example 1, except that a sapphire substrate was used, the temperature of the substrate in the gallium vapor deposition step B was changed to 550° C., and the temperature of the substrate in the nitriding step C was changed to 910° C. Then, CL property was evaluated in a manner identical to that of Example 1. The CL property was shown in FIG. 3.

Comparative Example 2

Gallium nitride mixed crystals were prepared in a manner identical to that of Example 1, except that the temperature of the substrate in the nitriding step C was changed to 980° C. Then, CL property was evaluated in a manner identical to that of Example 1. The CL property is shown in FIG. 3.

Example 2

Gallium nitride fine crystals were prepared in a manner identical to that of Example 1, except hat a substrate made of quartz was used. Then, CL property was evaluated in a manner identical to that of Example 1. The CL property was shown in FIG. 3.

Photoluminescence Property

Figure 5:
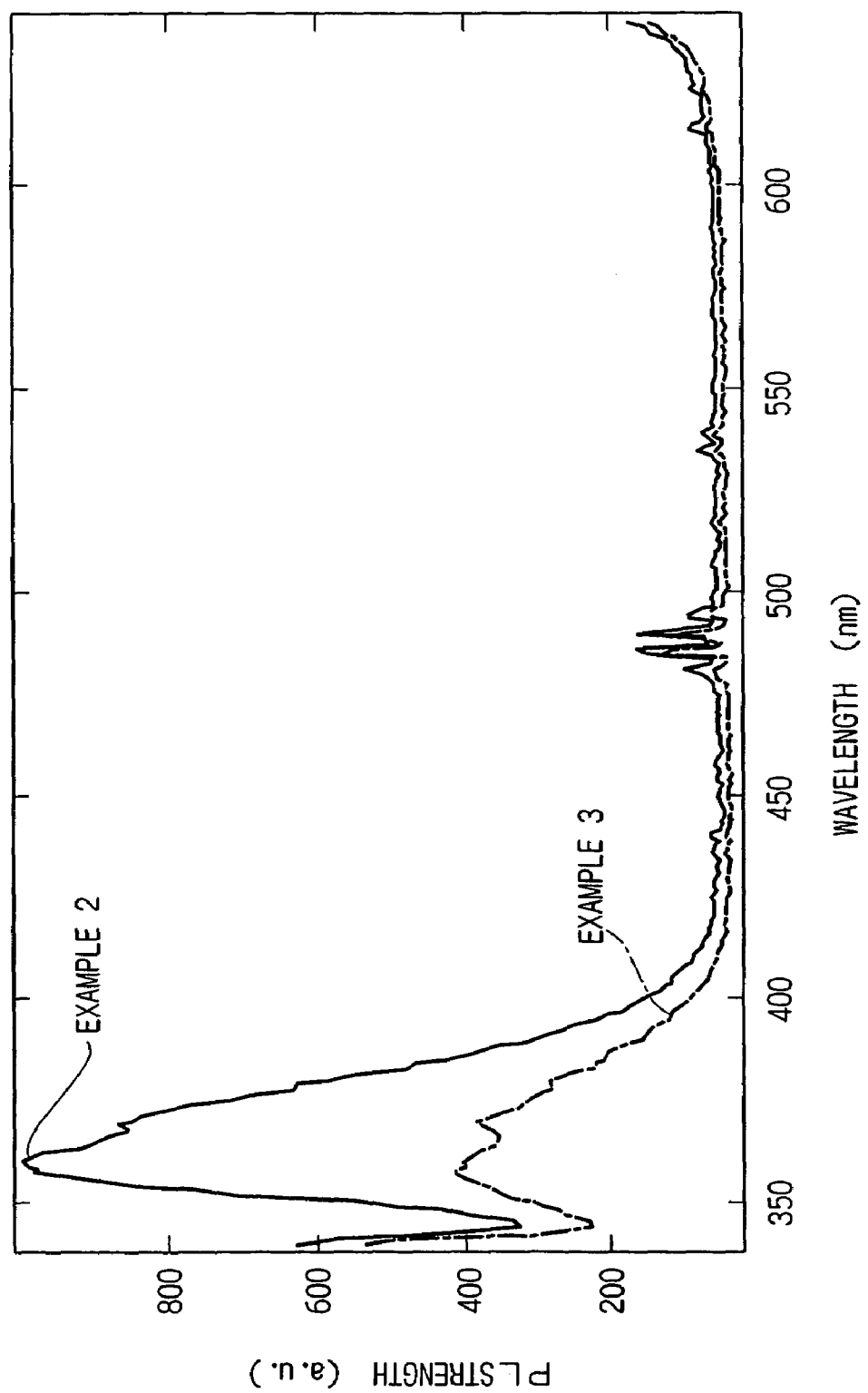
FIG. 5 shows PL property of gallium nitride of the Example 2 and the Comparative Example 3.

Photoluminescence (PL) property was evaluated by measuring luminescence dispersed spectrum in a PL method. A photoluminescence analyzer (marketed by JASCO Corporation) was used to irradiate a laser of 325 nm from an excitation light source of He—Cd to the fine crystals, and PL strength of wavelength of 340 to 640 nm was measured. The PL property of the gallium nitride fine crystals is shown in FIG. 5.

In addition, the surface of the gallium nitride fine crystals was observed using a (SEM). A SEM picture of gallium nitride fine crystals grown on the quartz substrate in the Example 2 is shown in FIG. 6.

Comparative Example 3

Gallium nitride fine crystals were prepared in a manner identical to that of Example 1, except that a quartz substrate was used, and the nitriding step A was not performed. After that, PL property was evaluated in a manner identical to that of the Example 2. The PL property is shown in FIG. 5. In addition, the surface of the gallium nitride fine crystals were observed by SEM, similarly in the Example 2. The SEM picture was shown in FIG. 6.

Comparative Example 4

Gallium nitride fine crystals were prepared in a manner identical to that of Example 1, except that a silicon substrate was used, and the nitriding step A was not performed. After that, PL property was evaluated in a manner identical to that of the Example 2. The luminescence due to PL property was completely observed.

According to the results of CL properties of FIG. 3, when the Example 1 is compared with the Comparative Examples 1 and 2, the CL strength near 370 nm which is the border of the gallium nitride band, of the fine crystals obtained in the Example 1 was high. In contrast, CL strength of the single crystal of the Comparative Example 1 is 1/200 of CL strength in the Example 1, and CL strength of the mixed crystals of the Comparative Example 2 is 1/2 of CL strength in the Example 1.

From these results, it was confirmed that the gallium nitride fine crystal have excellent CL property.

In addition, according to the SEM picture and the TEM picture of FIG. 4, in particular, FIG. 4A, it was confirmed that the gallium nitride obtained in the Example 1 is in a polycrystal condition. According to the picture of FIG. 4B, it was confirmed that these fine crystals are columnar crystals. According to the picture of FIG. 4C, a conversion was not observed in these fine crystals.

When the PL property in the Comparative Examples 3 and 4 are compared, luminescence due to PL property was not observed in the Comparative Example 4, and luminescence was observed at approximately 370 nm, which is the border of the gallium nitride band, in the Comparative Example 3. Thereby, it was confirmed that the gallium nitride of the Comparative Example 3 has no problem in practical use.

Based on the results of PL property of FIG. 5, when the Example 2 and the Comparative Example 3 were compared, it was found that the PL strength in the Example 2 is twice or greater than PL strength in the Comparative Example 3, and the Example 2 has also excellent PL property.

In other words, it was confirmed that the PL property was improved by performing the nitriding step A.

In addition, according to the SEM pictures of FIG. 6, it was found that the surface of the gallium nitride of the Example 2 was more flat and finer than the surface of the gallium nitride of the Comparative Example 3.

According to these results, it was confirmed that the heteroepitaxial growth method of gallium nitride of the present invention provides gallium nitride having excellent optical properties, which contains fine crystals having excellent quality, on a quart substrate or a silicone substrate.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A heteroepitaxial growth method for gallium nitride on the surface of a quartz substrate or a silicon substrate, the method comprising:

nitriding the surface of the substrate;
depositing or vapor depositing at least one atom layer of gallium; and
forming gallium nitride crystal particle groups.

2. A heteroepitaxial growth method for gallium nitride on the surface of a quartz substrate, the method comprising:
depositing or vapor depositing at least one atom layer of gallium on a nitride surface; and
forming gallium nitride crystal particle groups.

3. The heteroepitaxial growth method for gallium nitride according to claim 1, wherein the surface of the substrate is nitrided by at least one method selected from the group consisting of:
exposing the surface of the substrate to at least one material selected from the group consisting of an ammonia gas atmosphere, a gas atmosphere containing compounds having an ammonia group, a hydrazine gas atmosphere, a hydrazine derivatives gas atmosphere, a nitrogen atmosphere, and a nitrogen radical atmosphere,
contacting the surface of the substrate with a nitride solution, and
striking nitrogen ions to the surface of the substrate.

4. The heteroepitaxial growth method for gallium nitride according to claim 1, further comprising:
nitriding the surface of the atom layer which is obtained by depositing or vapor depositing gallium elements to prepare a surface thin film made of gallium nitride or a nitride crystal particle group on the atom layer of gallium on the substrate.

5. The heteroepitaxial growth method for gallium nitride according to claim 2, further comprising:
nitriding the surface of the atom layer which is obtained by depositing or vapor depositing gallium elements to prepare a surface thin film made of gallium nitride or a nitride crystal particle group on the atom layer of gallium on the substrate.

6. The heteroepitaxial growth method for gallium nitride according to claim 4, wherein the surface of the atom layer is nitrided by at least one method selected from the group consisting of:
exposing the surface of the atom layer of gallium to at least one material selected from the group consisting of an ammonia gas atmosphere, a gas atmosphere containing compounds having an ammonia group, a hydrazine gas atmosphere, a hydrazine derivatives gas atmosphere, a nitrogen atmosphere, and a nitrogen radicals atmosphere,
contacting the surface of the atom layer of gallium with a nitride solution, and
striking nitrogen ions to the surface of the atom layer.

7. The heteroepitaxial growth method for gallium nitride according to claim 5, wherein the surface of the atom layer is nitrided by at least one method selected from the group consisting of:
exposing the surface of the atom layer of gallium to at least one material selected from the group consisting of an ammonia gas atmosphere, a gas atmosphere containing compounds having an ammonia group, a hydrazine gas atmosphere, a hydrazine derivatives gas atmosphere, a nitrogen atmosphere, and a nitrogen radicals atmosphere,
contacting the surface of the atom layer with a nitride solution, and
striking nitrogen ions to the surface of the atom layer.

8. The heteroepitaxial growth method for gallium nitride according to claim 4, wherein nitriding the surface of the atom layer comprises:

supplying gallium elements together with a nitrogen supplying source containing nitrogen atom which is selected from the group consisting of ammonia, compounds having an ammonia group, hydrazine, hydrazine derivatives, nitrogen, nitrogen radicals, nitride solutions, and nitrogen ions.

9. The heteroepitaxial growth method for gallium nitride according to claim 5, wherein nitriding the surface of the atom layer comprises:

supplying gallium elements together with a nitrogen supplying source containing nitrogen atom which is selected from the group consisting of ammonia, compounds having an ammonia group, hydrazine, hydrazine derivatives, nitrogen, nitrogen radicals, nitride solutions, and nitrogen ions.

10. The heteroepitaxial growth method for gallium nitride according to claim 4, further comprising:

repeating the act of depositing or vapor depositing at least one atom layer of gallium and the act of nitriding the surface of the atom layer.

11. The heteroepitaxial growth method for gallium nitride according to claim 5, further comprising:

repeating the act of depositing or vapor depositing at least one atom layer of gallium and the-act of nitriding the surface of the atom layer.

12. The heteroepitaxial growth method for gallium nitride according to claim 10, wherein the nitriding further comprises supplying gallium during the nitriding.

13. The heteroepitaxial growth method for gallium nitride according to claim 11, wherein the nitriding further comprises supplying gallium during the nitriding.

* * * * *